US012787827B2

(12) United States Patent
Chen et al.

(10) Patent No.: US 12,787,827 B2

(45) Date of Patent: Nov. 3, 2026

(54) MULTI-DIE QFN HYBRID PACKAGE

(71) Applicant: MEDIATEK INC., Hsin-Chu (TW)

(72) Inventors: Hsin-Long Chen, Hsinchu City (TW); Chin-Chiang Chang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 555 days.

(21) Appl. No.: 18/200,590

(22) Filed: May 23, 2023

(65) Prior Publication Data

US 2024/0006278 A1 Jan. 4, 2024

Related U.S. Application Data

(60) Provisional application No. 63/357,654, filed on Jul. 1, 2022.

(51) Int. Cl.

*H10W 70/65* (2026.01)
*H10B 80/00* (2023.01)
*H10W 74/10* (2026.01)
*H10W 90/00* (2026.01)
*H10W 72/00* (2026.01)

(Continued)

(52) U.S. Cl.

CPC .......... *H10W 70/657* (2026.01); *H10B 80/00* (2023.02); *H10W 74/111* (2026.01); *H10W 90/00* (2026.01); *H10W 72/07552* (2026.01); *H10W 72/252* (2026.01); *H10W 72/50* (2026.01); *H10W 72/521* (2026.01); *H10W 72/884* (2026.01); *H10W 90/724* (2026.01); *H10W 90/732* (2026.01); *H10W 90/736* (2026.01)

(58) Field of Classification Search

CPC ........... H01L 23/49805; H01L 23/3107; H01L 24/16; H01L 24/32; H10W 70/657; H10W 74/111; H10W 90/00; H10W 72/07552; H10B 80/00

See application file for complete search history.

(56) References Cited

U.S. PATENT DOCUMENTS 6,358,775 B1 * 3/2002 Hsia .................... H10W 70/415 438/111
7,166,495 B2 * 1/2007 Ball ..................... H10D 62/117 257/E21.705

(Continued)

FOREIGN PATENT DOCUMENTS

CN 102569270 A * 7/2012 .......... H10W 70/481
CN 102956629 A * 3/2013 .......... H10W 90/811

(Continued)

*Primary Examiner* — Laura M Menz

(74) *Attorney, Agent, or Firm* — Winston Hsu

(57) ABSTRACT

A multi-die QFN hybrid package includes a carrier having flip-chip leads and wire-bonding leads. A first die and a second die are mounted on the flip-chip leads, respectively, in a flip-chip manner. The first die is spaced apart from the second die. A third die is stacked over the first die and the second die. The third die is electrically connected to the wire-bonding leads around the first die and the second die through bond wires. A mold cap encapsulates the first die, the second die, the third die, the bond wires, and partially encapsulates the carrier. The flip-chip leads and the wire-bonding leads are exposed from a bottom mold cap surface.

19 Claims, 1 Drawing Sheet

(51) Int. Cl.
*H10W 72/20* (2026.01)
*H10W 72/50* (2026.01)

(56) References Cited

U.S. PATENT DOCUMENTS

| | | | | |
|---|---|---|---|---|
| 7,906,844 | B2 * | 3/2011 | Cui | H10W 90/00<br>257/707 |
| 8,354,742 | B2 * | 1/2013 | Camacho | H10W 40/778<br>257/E23.116 |
| 8,358,013 | B1 * | 1/2013 | Liou | H10W 70/415<br>257/777 |
| 8,828,801 | B2 * | 9/2014 | McMillan | H10W 70/042<br>438/111 |
| 9,524,957 | B2 * | 12/2016 | Hebert | H10W 40/22 |
| 9,870,946 | B2 * | 1/2018 | Yu | H10W 20/023 |
| 10,290,618 | B2 * | 5/2019 | Hebert | H10W 40/22 |
| 11,069,573 | B2 * | 7/2021 | Yu | H10W 20/023 |
| 11,728,217 | B2 * | 8/2023 | Yu | H10W 20/023<br>257/774 |
| 12,322,726 | B2 * | 6/2025 | Hsieh | H10W 20/023 |
| 2002/0045290 | A1 * | 4/2002 | Ball | H10D 62/117<br>257/E21.705 |
| 2002/0074637 | A1 * | 6/2002 | McFarland | H10W 20/49<br>257/E23.146 |
| 2004/0164382 | A1 * | 8/2004 | Gerber | H10W 70/427<br>257/E23.047 |
| 2005/0082645 | A1 * | 4/2005 | Lee | H10W 42/265<br>257/E23.032 |
| 2006/0249851 | A1 * | 11/2006 | Karnezos | H10W 74/117<br>257/E25.023 |
| 2007/0109756 | A1 * | 5/2007 | Park | H10D 62/117<br>257/E25.013 |
| 2007/0152325 | A1 * | 7/2007 | Dani | H10W 40/251<br>257/E23.101 |
| 2009/0045523 | A1 * | 2/2009 | Fan | H05K 3/3436<br>257/E23.141 |
| 2009/0243064 | A1 * | 10/2009 | Camacho | H10W 40/778<br>257/E23.116 |
| 2012/0228696 | A1 * | 9/2012 | Carpenter | H10W 70/465<br>257/329 |
| 2013/0043940 | A1 * | 2/2013 | Hebert | H10W 40/22<br>257/737 |
| 2013/0273692 | A1 * | 10/2013 | McMillan | H10W 70/042<br>438/108 |
| 2014/0203457 | A1 | 7/2014 | Kim | |
| 2015/0187743 | A1 * | 7/2015 | Yu | H10W 20/023<br>257/774 |
| 2015/0332986 | A1 * | 11/2015 | Tomohiro | H10W 70/40<br>257/737 |
| 2015/0348934 | A1 | 12/2015 | Qin | |
| 2016/0118365 | A1 * | 4/2016 | Singh | H10W 70/042<br>257/676 |
| 2017/0053904 | A1 * | 2/2017 | Hebert | H10W 40/22 |
| 2017/0287816 | A1 * | 10/2017 | Vreman | H10W 70/417 |
| 2018/0138089 | A1 * | 5/2018 | Yu | H10W 20/023 |
| 2018/0190622 | A1 * | 7/2018 | Lin | H10P 72/74 |
| 2019/0206772 | A1 * | 7/2019 | How | H10W 70/047 |
| 2019/0267365 | A1 * | 8/2019 | Hebert | H10W 40/22 |
| 2020/0411488 | A1 * | 12/2020 | Yu | H10W 70/09 |
| 2021/0351076 | A1 * | 11/2021 | Yu | H10W 20/023 |
| 2023/0187327 | A1 * | 6/2023 | Lee | H10W 70/047<br>257/676 |
| 2023/0282614 | A1 * | 9/2023 | Hsieh | H10W 20/023<br>257/700 |
| 2024/0006278 | A1 * | 1/2024 | Chen | H10B 80/00 |
| 2024/0297147 | A1 * | 9/2024 | Loo | H10W 70/042 |
| 2025/0286016 | A1 * | 9/2025 | Hsieh | H10W 20/023 |

FOREIGN PATENT DOCUMENTS

| | | | | | |
|---|---|---|---|---|---|
| CN | 104600064 | A | * | 5/2015 | H10W 90/00 |
| CN | 105097750 | A | * | 11/2015 | H10W 90/701 |
| CN | 207781575 | U | * | 8/2018 | H10W 71/129 |
| CN | 110211948 | A | * | 9/2019 | H10W 90/811 |
| CN | 117334662 | A | * | 1/2024 | H10W 70/461 |
| EP | 4300566 | A1 | * | 1/2024 | H10W 90/00 |
| KR | 20150080429 | A | * | 7/2015 | H10W 90/00 |
| KR | 101803601 | B1 | * | 11/2017 | H10W 90/00 |
| KR | 20180127303 | A | * | 11/2018 | H10W 90/00 |
| WO | WO-2004027823 | A2 | * | 4/2004 | H10W 70/611 |
| WO | WO-2005031805 | A2 | * | 4/2005 | H10W 74/111 |
| WO | WO-2006044804 | A2 | * | 4/2006 | H10W 90/00 |
| WO | WO-2019066988 | A1 | * | 4/2019 | H10W 90/00 |
| WO | WO-2019066991 | A1 | * | 4/2019 | H10W 90/00 |

* cited by examiner

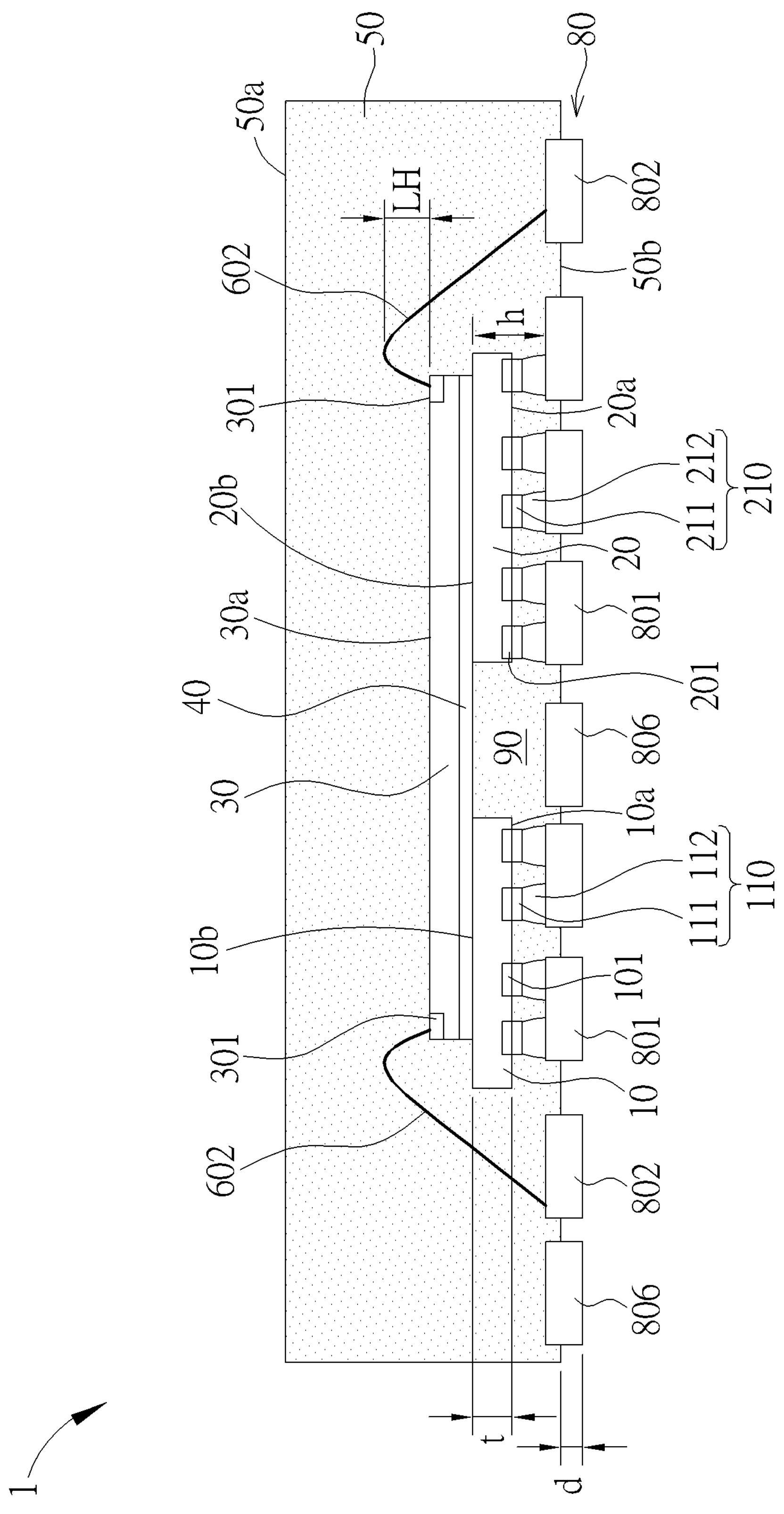
50
80
50a
802
LH
602
50b
h
301
20a
212
210
20b
211
20
30a
801
201
40
90
806
30
10a
112
110
111
10b
101
301
801
10
602
802
806
t
d
1

MULTI-DIE QFN HYBRID PACKAGE

CROSS REFERENCE TO RELATED APPLICATIONS

This application claims the benefit of U.S. Provisional Application No. 63/357,654, filed on Jul. 1, 2022. The content of the application is incorporated herein by reference.

BACKGROUND

The present disclosure related generally to the field of semiconductor packaging.

Hybrid package is a package technology stacking one wire-bonded die on the top of a bottom die that is mounted on a package substrate in a flip-chip manner. For example, a hybrid package can integrate an ASIC and a memory die such as flash, SRAM or DDR into one package.

Hybrid packages deliver increased functionality and performance. Besides, they offer procurement flexibility compared to individually package die. Hybrid packages are suited for wireless applications such as cell phones and consumer products.

However, the prior art hybrid package has a drawback in that the package substrate is expensive and the thermal performance is not satisfactory. It is also desirable to provide a hybrid package having reduced overall package height.

SUMMARY

It is one object of the present disclosure to provide an improved multi-die quad-flat no-lead (QFN) hybrid package in order to solve the prior art shortcomings or deficiencies.

One aspect of the disclosure provides a multi-die quad-flat no-lead (QFN) hybrid package including a carrier having a plurality of flip-chip leads and a plurality of wire-bonding leads. A first integrated circuit die and a second integrated circuit die are mounted on the plurality of flip-chip leads, respectively, in a flip-chip manner. The first integrated circuit die is spaced apart from the second integrated circuit die. A third integrated circuit die is stacked over the first integrated circuit die and the second integrated circuit die. The third integrated circuit die is electrically connected to the plurality of wire-bonding leads around the first integrated circuit die and the second integrated circuit die through a plurality of bond wires. A mold cap encapsulates the first integrated circuit die, the second integrated circuit die, the third integrated circuit die, the plurality of bond wires, and partially encapsulates the carrier. The mold cap includes a bottom mold cap surface. The plurality of flip-chip leads and the plurality of wire-bonding leads are exposed from the bottom mold cap surface.

According to some embodiments, the carrier is a copper leadframe carrier.

According to some embodiments, the first integrated circuit die is coplanar with the second integrated circuit die.

According to some embodiments, the first integrated circuit die and the second integrated circuit die have the same die height.

According to some embodiments, the die height ranges between 100 micrometers and 300 micrometers.

According to some embodiments, the first integrated circuit die and the second integrated circuit die have the same die thickness.

According to some embodiments, the die thickness ranges between 100 micrometers and 250 micrometers.

According to some embodiments, the plurality of flip-chip leads is partially exposed from the bottom mold cap surface for further connection with an external circuit such as a main board or a printed circuit board.

According to some embodiments, the first integrated circuit die and the second integrated circuit die are electrically connected to the plurality of flip-chip leads through a plurality of connecting elements, respectively.

According to some embodiments, the plurality of connecting elements comprises a copper bump or a solder bump.

According to some embodiments, each of the plurality of connecting elements comprises a copper pillar and a solder cap.

According to some embodiments, the multi-die QFN hybrid package further comprises a channel between the first integrated circuit die, the second integrated circuit die, and the third integrated circuit die.

According to some embodiments, the channel is filled with the mold cap.

According to some embodiments, the third integrated circuit die is adhered to a rear surface of the first integrated circuit die and a rear surface of the second integrated circuit die using an adhesive or a die attach film.

According to some embodiments, the third integrated circuit die is a memory die.

According to some embodiments, the memory die comprises a DDR DRAM die.

According to some embodiments, the plurality of bond wires comprises a copper wire.

According to some embodiments, a loop height of the bond wires is less than or equal to 400 micrometers.

According to some embodiments, a standoff height between the bottom mold cap surface and a bottom surface of the carrier is less than or equal to 50 micrometers.

According to some embodiments, the first integrated circuit die and the second integrated circuit die comprise a power management chip, a wifi chip module, or an application specific integrated circuit (ASIC).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a schematic, cross-sectional diagram showing an exemplary multi-die quad-flat no-lead (QFN) hybrid package in accordance with an embodiment of the invention.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

FIG. 1 is a schematic, cross-sectional diagram showing an exemplary multi-die quad-flat no-lead (QFN) hybrid package in accordance with an embodiment of the invention. As shown in FIG. 1, the multi-die QFN hybrid package 1 comprises a first integrated circuit die 10 and a second integrated circuit die 20 encapsulated within a mold cap 50 in a side-by-side manner. According to an embodiment, the first integrated circuit die 10 is physically separated from the second integrated circuit die 20. According to an embodiment, the mold cap 50 may be composed of an epoxy resin mixed with fillers. According to an embodiment, the mold cap 50 has a top mold cap surface 50*a* and a bottom mold cap surface 50*b* opposite to the top mold cap surface 50*a*.

According to an embodiment, for example, the first integrated circuit die 10 and the second integrated circuit die 20 may comprise a power management chip, a wifi chip module, or an application specific integrated circuit (ASIC), but is not limited thereto. According to an embodiment, the first integrated circuit die 10 is spaced apart from the second integrated circuit die According to an embodiment, the first integrated circuit die 10 is coplanar with the second integrated circuit die 20. According to an embodiment, the first integrated circuit die 10 and the second integrated circuit die 20 have substantially the same die height h ranging, for example, between 100 micrometers and 300 micrometers. According to an embodiment, the first integrated circuit die 10 and the second integrated circuit die 20 have substantially the same die thickness t ranging, for example, between 100 micrometers and 250 micrometers.

According to an embodiment, the first integrated circuit die 10 and the second integrated circuit die 20 are mounted on a plurality of flip-chip leads (or terminals) 801 of a carrier 80 such as a copper leadframe carrier in a flip-chip manner. According to an embodiment, the plurality of flip-chip leads 801 is partially exposed from a bottom mold cap surface 50*b* for further connection with an external circuit such as a main board or a printed circuit board. According to an embodiment, the plurality of flip-chip leads 801 may comprise copper, but is not limited thereto.

According to an embodiment, the first integrated circuit die 10 and the second integrated circuit die 20 may be electrically connected to the plurality of flip-chip leads 801 through a plurality of connecting elements 110 and 210, respectively. According to an embodiment, for example, the plurality of connecting elements 110 and 210 may comprise copper bumps or solder bumps, but is not limited thereto. According to an embodiment, for example, each of the plurality of connecting elements 110 may comprise a copper pillar 111 and a solder cap 112, but is not limited thereto. According to an embodiment, for example, each of the plurality of connecting elements 210 may comprise a copper pillar 211 and a solder cap 212, but is not limited thereto.

According to an embodiment, the first integrated circuit die 10 has an active surface 10*a* and a rear surface 10*b*. According to an embodiment, the first integrated circuit die 10 comprises a plurality of input/output (I/O) terminals 101 distributed on the active surface 10*a*. According to an embodiment, the plurality of connecting elements 110 may be disposed on the plurality of I/O terminals 101, respectively.

According to an embodiment, the second integrated circuit die 20 has an active surface and a rear surface 20*b*. According to an embodiment, the second integrated circuit die 20 comprises a plurality of input/output (I/O) terminals 201 distributed on the active surface 20*a*. According to an embodiment, the plurality of connecting elements 210 may be disposed on the plurality of I/O terminals 201, respectively. According to an embodiment, the rear surface 10*b* of the first integrated circuit die 10 may be flush with the rear surface 20*b* of the second integrated circuit die 20.

According to an embodiment, for example, the multi-die QFN hybrid package 1 further comprises a third integrated circuit die 30 stacked on the first integrated circuit die 10 and the second integrated circuit die 20, thereby forming a channel 90 therebetween. According to an embodiment, the channel 90 is filled with the mold cap 50. According to an embodiment, for example, the third integrated circuit die 30 may be adhered to the rear surface 10*b* of the first integrated circuit die 10 and the rear surface 20*b* of the second integrated circuit die 20 using an adhesive or a die attach film 40. According to an embodiment, for example, the third integrated circuit die 30 may be a memory die such as a DDR DRAM die, but is not limited thereto. According to another embodiment, the third integrated circuit die 30 may be directly stacked on either the first integrated circuit die 10 or the second integrated circuit die 20.

According to an embodiment, the third integrated circuit die 30 has an active surface 30*a* and a plurality of I/O pads 301 disposed along perimeter of the active surface 30*a*. The plurality of I/O pads 301 is electrically connected to a plurality of wire-bonding leads 802 around the first integrated circuit die 10 and the second integrated circuit die 20 through a plurality of bond wires 602. According to an embodiment, the plurality of bond wires 602 may be copper wires or gold wires, but is not limited thereto. According to an embodiment, the loop height LH of the bond wires 602 may be less than or equal to 400 micrometers.

According to an embodiment, optionally, the multi-die QFN hybrid package 1 may further comprises dummy leads 806. According to an embodiment, a standoff height d between the bottom mold cap surface 50*b* and the bottom surface of the carrier 80 may be less than or equal to micrometers.

It is advantageous to use the present disclosure because the package size and the production cost can be reduced. Compared to the prior art, the thermal performance of the multi-die QFN hybrid package 1 can be increased due to the use of the leadframe carrier 80. Further, compared to the prior art, the electrical performance of the multi-die QFN hybrid package 1 can be increased because the length of the bond wires 602 can be shorter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-die quad-flat no-lead (QFN) hybrid package, comprising:

a carrier comprising a plurality of flip-chip leads and a plurality of wire-bonding leads;

a first integrated circuit die and a second integrated circuit die mounted on the plurality of flip-chip leads, respectively, in a flip-chip manner, wherein the first integrated circuit die is spaced apart from the second integrated circuit die, wherein the first integrated circuit die has a first active surface and a plurality of first terminals distributed on the first active surface, the second integrated circuit die has a second active surface and a plurality of second terminals distributed on the second active surface, wherein both of the first active surface and second active surface directly face the flip-chip leads, wherein the plurality of first terminals of the first integrated circuit die and the plurality of second terminals of the second integrated circuit die are electrically connected to the plurality of flip-chip leads through a plurality of conductive bumps, respectively;

a third integrated circuit die stacked over the first integrated circuit die and the second integrated circuit die, wherein the third integrated circuit die is electrically connected to the plurality of wire-bonding leads around the first integrated circuit die and the second integrated circuit die through a plurality of bond wires; and a mold cap encapsulating the first integrated circuit die, the second integrated circuit die, the third integrated circuit die, the plurality of bond wires, and partially encapsulating the carrier, wherein the mold cap comprises a bottom mold cap surface, and wherein the plurality of flip-chip leads and the plurality of wire-bonding leads are exposed from the bottom mold cap surface.

2. The multi-die QFN hybrid package according to claim 1, wherein the carrier is a copper leadframe carrier.

3. The multi-die QFN hybrid package according to claim 1, wherein the first integrated circuit die is coplanar with the second integrated circuit die.

4. The multi-die QFN hybrid package according to claim 1, wherein the first integrated circuit die and the second integrated circuit die have the same die height.

5. The multi-die QFN hybrid package according to claim 4, wherein the die height ranges between 100 micrometers and 300 micrometers.

6. The multi-die QFN hybrid package according to claim 1, wherein the first integrated circuit die and the second integrated circuit die have the same die thickness.

7. The multi-die QFN hybrid package according to claim 6, wherein the die thickness ranges between 100 micrometers and 250 micrometers.

8. The multi-die QFN hybrid package according to claim 1, wherein the plurality of flip-chip leads is partially exposed from the bottom mold cap surface for further connection with an external circuit such as a main board or a printed circuit board.

9. The multi-die QFN hybrid package according to claim 1, wherein the plurality of connecting bumps comprises a copper bump or a solder bump.

10. The multi-die QFN hybrid package according to claim 1, wherein each of the plurality of connecting bumps comprises a copper pillar and a solder cap.

11. The multi-die QFN hybrid package according to claim 1 further comprising:

a channel between the first integrated circuit die, the second integrated circuit die, and the third integrated circuit die.

12. The multi-die QFN hybrid package according to claim 11, wherein the channel is filled with the mold cap.

13. The multi-die QFN hybrid package according to claim 1, wherein the third integrated circuit die is adhered to a rear surface of the first integrated circuit die and a rear surface of the second integrated circuit die using an adhesive or a die attach film.

14. The multi-die QFN hybrid package according to claim 1, wherein the third integrated circuit die is a memory die.

15. The multi-die QFN hybrid package according to claim 14, wherein the memory die comprises a DDR DRAM die.

16. The multi-die QFN hybrid package according to claim 1, wherein the plurality of bond wires comprises a copper wire.

17. The multi-die QFN hybrid package according to claim 16, wherein a loop height of the bond wires is less than or equal to 400 micrometers.

18. The multi-die QFN hybrid package according to claim 1, wherein a standoff height between the bottom mold cap surface and a bottom surface of the carrier is less than or equal to 50 micrometers.

19. The multi-die QFN hybrid package according to claim 1, wherein the first integrated circuit die and the second integrated circuit die comprise a power management chip, a wifi chip module, or an application specific integrated circuit (ASIC).

* * * * *